(12) United States Patent
Sharp et al.

(10) Patent No.: US 7,763,792 B2
(45) Date of Patent: Jul. 27, 2010

(54) MULTISTAGE HEAT PUMPS AND METHOD OF MANUFACTURE

(75) Inventors: Jeffrey W. Sharp, Richardson, TX (US); James L. Bierschenk, Rowlett, TX (US)

(73) Assignee: Marlow Industries, Inc., Dallas, TX (US)

( * ) Notice: Subject to any disclaimer, the term of this patent is extended or adjusted under 35 U.S.C. 154(b) by 1059 days.

(21) Appl. No.: 11/058,029

(22) Filed: Feb. 14, 2005

(65) Prior Publication Data
US 2006/0180192 A1  Aug. 17, 2006

(51) Int. Cl.
*H01L 35/28* (2006.01)
(52) U.S. Cl. .................... 136/224; 136/200
(58) Field of Classification Search .............. 136/224
See application file for complete search history.

(56) References Cited
U.S. PATENT DOCUMENTS 5,022,928 A * 6/1991 Buist .................... 136/212
5,456,081 A * 10/1995 Chrysler et al. ............ 62/3.7
2003/0084935 A1 * 5/2003 Bell ....................... 136/200

* cited by examiner

*Primary Examiner*—Alexa D Neckel
*Assistant Examiner*—Miriam Berdichevsky
(74) *Attorney, Agent, or Firm*—Baker Botts L.L.P.

(57) ABSTRACT

A thermoelectric module is provided that includes a first thermally conductive plate with a first array of thermoelectric elements coupled to it. The first array of thermoelectric elements includes a first plurality of thermoelectric elements. The thermoelectric module also includes a second thermally conductive plate coupled to the first array of thermoelectric elements, and a second array of thermoelectric elements coupled to the second plate. The second array of thermoelectric elements includes a second plurality of thermoelectric elements. A third thermally conductive plate is coupled to the second array of thermoelectric elements. The thermoelectric module also includes a portion of each thermoelectric element of the first and second pluralities of thermoelectric elements being coplanar with at least a portion of every other thermoelectric element of the first and second pluralities of thermoelectric elements.

31 Claims, 6 Drawing Sheets

MULTISTAGE HEAT PUMPS AND METHOD OF MANUFACTURE

TECHNICAL FIELD OF THE INVENTION

This invention relates in general to thermoelectric cooling devices, and more particularly to multistage heat pumps and method of manufacture.

BACKGROUND OF THE INVENTION

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components.

Thermoelectric materials such as alloys of $Bi_2Te_3$, PbTe and BiSb were developed thirty to forty years ago. More recently, semiconductor alloys such as SiGe have been used in the fabrication of thermoelectric devices. Typically, a thermoelectric device incorporates both a P-type semiconductor and an N-type semiconductor alloy as the thermoelectric materials.

Some cooling applications may require thermal energy transfer over a larger temperature difference than a single-stage thermoelectric module can provide. In these applications, multistage thermoelectric modules may be employed.

SUMMARY OF THE INVENTION

In accordance with the present invention, the disadvantages and problems associated with multistage thermoelectric modules have been substantially reduced or eliminated. In particular, multistage thermoelectric modules are provided which maintain the efficiency and increased heat pumping ability of traditional multistage thermoelectric modules, while being relatively slimmer and more compact.

In accordance with one embodiment of the present invention, a thermoelectric module is provided that includes a first thermally conductive plate with a first array of thermoelectric elements coupled to it. The first array of thermoelectric elements includes a first plurality of thermoelectric elements. The thermoelectric module also includes a second thermally conductive plate coupled to the first array of thermoelectric elements, and a second array of thermoelectric elements coupled to the second plate. The second array of thermoelectric elements includes a second plurality of thermoelectric elements. A third thermally conductive plate is coupled to the second array of thermoelectric elements. The thermoelectric module also includes a portion of each thermoelectric element of the first and second pluralities of thermoelectric elements being coplanar with at least a portion of every other thermoelectric element of the first and second pluralities of thermoelectric elements.

Particular embodiments of the thermoelectric module may include at least a portion of the first, second, and third plates being coplanar with at least a portion of each of thermoelectric elements of the first and second pluralities of thermoelectric elements. An alternative particular embodiment may include the second plate encircling the third plate, and the first plate encircling the second and third plates. A further alternative embodiment may include the first plate encircling the third plate, and the second plate being generally parallel to the first and third plates.

In accordance with another embodiment of the present invention, a method of manufacturing a thermoelectric module is provided, including coupling a first array of thermoelectric elements including a first plurality of thermoelectric elements to a first thermally conductive plate. The method also includes coupling a second thermally conductive plate to the first array of thermoelectric elements, and coupling a second array of thermoelectric elements including a second plurality of thermoelectric elements to the second plate. A third thermally conductive plate is then coupled to the second array of thermoelectric elements. At least a portion of each thermoelectric element of the first and second pluralities of thermoelectric elements are coplanar with at least a portion of every other thermoelectric element of the first and second pluralities of thermoelectric elements.

Particular embodiments of the method may include forming the first and third plates by cutting apart a single large plate. An alternative particular embodiment may include the first plate including a plurality of plates, and forming the plurality of plates by cutting apart a single large plate. A further alternative particular embodiment may include coupling a third array of thermoelectric elements to the third plate, and coupling a fourth thermally conductive plate to the third array of thermoelectric elements. A fourth array of thermoelectric elements may be coupled to the first plate, and a fifth thermally conductive plate may be coupled to the fourth array of thermoelectric elements. This embodiment may also include at least a portion of each thermoelectric element of the first, second, and third pluralities of thermoelectric elements being coplanar with at least a portion of every other thermoelectric element of the first, second, and third pluralities of thermoelectric elements. Further, at least a portion of each of the thermoelectric elements of the fourth array of thermoelectric elements may reside in a plane in which no portion of any one of the thermoelectric elements of the first, second, and third arrays of thermoelectric elements reside.

Technical advantages of certain embodiments of the present invention include a relatively slim thermoelectric module which is capable of transferring thermal energy radially outwards from a device to be cooled. The module may be the same thickness as a traditional thermoelectric module, but may include multiple stages arranged in a radial layout. This module may allow heat transfer in a radial direction when a device to be cooled is located in the center of the thermoelectric module. This provides greater directivity in heat transfer and greater flexibility of design.

Other technical advantages of certain embodiments of the present invention include multistage thermoelectric modules which may be manufactured using traditional single-stage thermoelectric module methods and machinery. The thermoelectric elements of the modules may all be disposed within a single plane. The coplanar nature of the thermoelectric elements allows manufacture by one or more of the same, or slightly modified, methods as used for traditional single-stage modules. This may allow avoidance of the expenses and downtime related to retooling and retraining.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
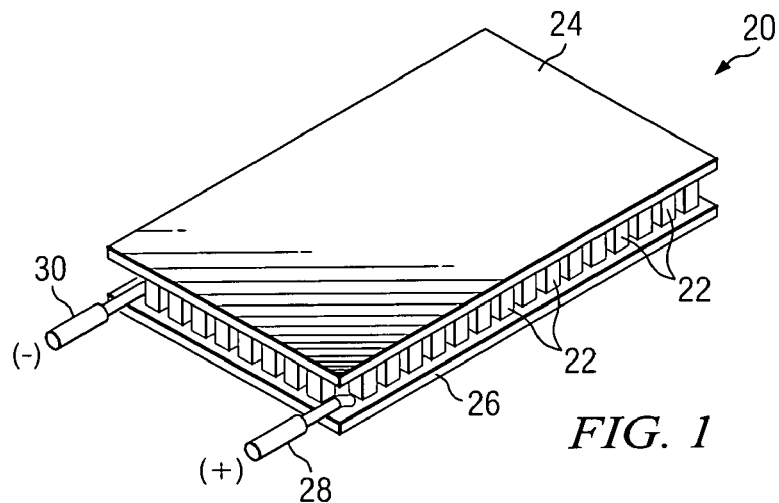
FIG. 1 is a schematic drawing showing an isometric view of a thermoelectric device having multiple thermoelectric elements.

FIG. 1 illustrates a thermoelectric device 20 including a plurality of thermoelectric elements 22 disposed between a cold plate 24 and a hot plate 26. Electrical connections 28 and 30 are provided to allow thermoelectric device 20 to be electrically coupled with an appropriate source of DC electrical power.

Thermoelectric device 20 may be used as a heater, cooler, electrical power generator, and/or temperature sensor. If thermoelectric device 20 were designed to function as an electrical power generator, electrical connections 28 and 30 would represent the output terminals from such a power generator operating between hot and cold temperature sources.

Figure 2:
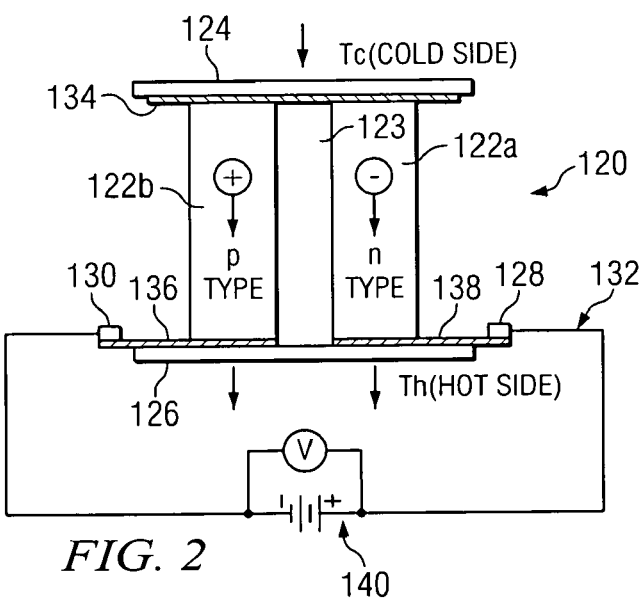
FIG. 2 is an electrical schematic drawing of one thermocouple of the thermoelectric device of FIG. 1.

FIG. 2 is a schematic representation of an electrical circuit 132 of a single-stage thermoelectric device 120. Electrical circuit 132 may also be incorporated with thermoelectric elements or thermocouples to convert heat energy into electrical energy. Electrical circuit 132 generally includes two or more thermoelectric elements 122 fabricated from dissimilar semiconductor materials such as N-type thermoelectric elements 122a and P-type thermoelectric elements 122b. Thermoelectric elements 122 are typically configured in a generally alternating N-type element to P-type element arrangement and typically include an air gap 123 disposed between adjacent N-type and P-type elements. In many thermoelectric devices, thermoelectric materials with dissimilar characteristics are connected electrically in series and thermally in parallel.

Examples of thermoelectric devices and methods of fabrication are shown in U.S. Pat. No. 5,064,476 entitled Thermoelectric Cooler and Fabrication Method; U.S. Pat. No. 5,171,372 entitled Thermoelectric Cooler and Fabrication Method; and U.S. Pat. No. 5,576,512 entitled Thermoelectric Apparatus for Use With Multiple Power Sources and Method of Operation.

N-type semiconductor materials generally have more electrons than necessary to complete the associated crystal lattice structure. P-type semiconductor materials generally have fewer electrons than necessary to complete the associated crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers which transport or move heat energy between cold side or cold plate 124 and hot side or hot plate 126 through thermoelectric elements 122 when subject to a DC voltage potential. These same agents or carriers may generate electrical power when an appropriate temperature difference is present between cold side 124 and hot side 126.

In thermoelectric device 120, alternating thermoelectric elements 122a, and 122b of N-type and P-type semiconductor materials may have their ends connected by electrical conductors such as 134, 136 and 138. Conductors 134, 136 and 138 may be metallizations formed on thermoelectric elements 122a, 122b and/or on the interior surfaces of plates 124 and 126. Ceramic materials are frequently used to manufacture plates 124 and 126 which define in part the cold side and hot side, respectively, of thermoelectric device 120. Commercially available thermoelectric devices which function as a cooler generally include two ceramic plates with separate P-type and N-type thermoelectric elements formed from bismuth telluride ($Bi_2Te_3$) alloys disposed between the ceramic plates and electrically connected with each other.

When DC electrical power from power supply 140 is properly applied to thermoelectric device 120 heat energy will be absorbed on cold side 124 of thermoelectric elements 122 and will be dissipated on hot side 126 of thermoelectric device 120. A heat sink or heat exchanger (sometimes referred to as a "hot sink") may be attached to hot plate 126 of thermoelectric device 120 to aid in dissipating heat transferred by the associated carriers and phonons through thermoelectric elements 122 to the adjacent environment. In a similar manner, a heat sink or heat exchanger (sometimes referred to as a "cold sink") may be attached to cold side 124 of thermoelectric device 120 to aid in removing heat from the adjacent environment. Thus, thermoelectric device 120 may sometimes function as a thermoelectric cooler when properly connected with power supply 140. However, since thermoelectric devices are a type of heat pump, thermoelectric device 120 may also function as a heater, power generator, or temperature sensor.

Thermoelectric coolers may be constructed by assembling one or more arrays of thermoelectric elements between two or more temperature plates. The thermoelectric elements are small blocks of P and N semiconductors, and within the array(s) the elements are arranged electrically in series and thermally in parallel. When an electrical current is supplied, the array(s) of elements provide a temperature difference between the plates, which are ideally isothermal. In a cooling application, the object or fluid to be cooled is in contact with the coldest plate, and a heat sink is attached to the hottest plate. For the purpose of this discussion, it is further helpful to classify thermoelectric coolers as either single stage or multistage.

In a single stage cooler, the full temperature difference between the cooled object and the heat sink, ignoring any heat lost to the ambient by the cooled object, is provided by a single array of elements. In a multistage cooler, the full temperature difference is divided between at least two arrays of elements, leading to increases in efficiency and allowing greater temperature differences. The multiple arrays may be electrically in series with one another, but they are not thermally in parallel. A single stage cooler consists of one array of elements, one cold plate and one hot plate. A two-stage cooler may consist of two arrays of elements, one cold plate, one intermediate plate, and one hot plate. In general, an N-stage cooler consists of N arrays of elements, one cold plate, N−1 intermediate plates and one hot plate.

Figure 3:
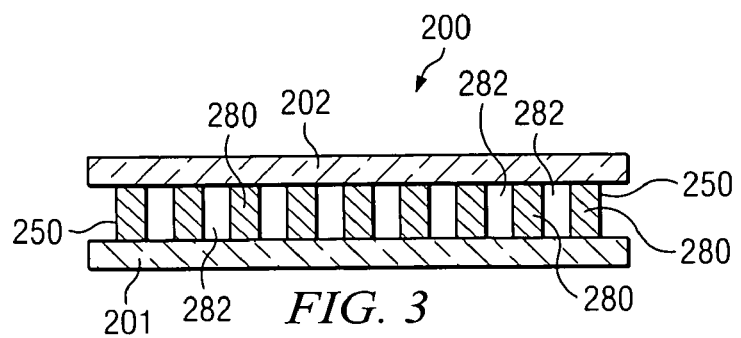
FIG. 3 illustrates a profile view of a single-stage thermoelectric module.

FIG. 3 illustrates a profile view of a typical single-stage thermoelectric module 200. Thermoelectric module 200 includes a first plate 201 and a second plate 202. First plates 201 and second plate 202 may be thermally conductive plates. Between first plate 201 and second plate 202 is an array of thermoelectric elements 250. Array of thermoelectric elements 250 includes a plurality of thermoelectric elements 280 separated by insulators 282. A thermoelectric element 280 may be made of either P-type or N-type thermoelectric material. Array of thermoelectric elements 250 will include thermoelectric elements 280 of both N-type and P-type, which may or may not be arranged in an alternating pattern depending on the arrangement of the electrical interconnects between the thermoelectric elements 280. In the illustrated embodiment, insulators 282 are spaces that are open to the ambient environment. In an alternative embodiment, insulators 282 may be thermally and electrically insulating material.

A heat sensitive device, or any device requiring cooling, may be coupled to second plate 202. A current may be passed through the array of thermoelectric elements 250 resulting in a transfer of thermal energy from second plate 202 to first plate 201. First plate 201 may have a heat sink coupled to it. In this manner, thermal energy may be actively pumped from a device to be cooled, through thermoelectric module 200, and into the heat sink where it can be dissipated to the ambient environment. In this configuration, the full temperature difference between the object to be cooled and the heat sink, ignoring any heat transferred directly from the object to be cooled to ambient, is provided by thermoelectric module 200.

Figure 4:
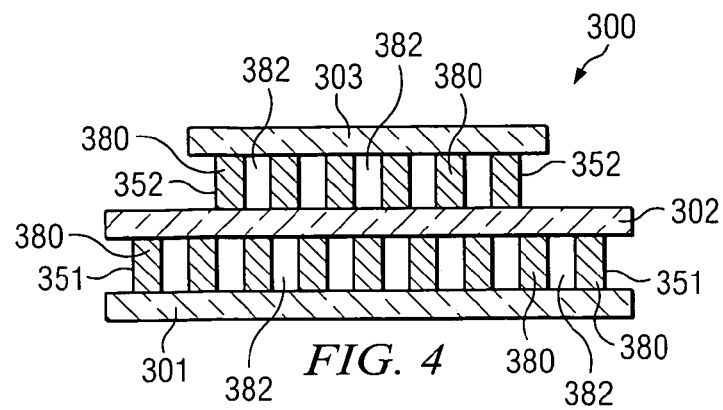
FIG. 4 illustrates a profile view of one embodiment of a longitudinally stacked two-tier multistage thermoelectric module.

FIG. 4 illustrates a profile view of a longitudinally stacked two-stage thermoelectric module 300. Coupling thermoelectric modules together by longitudinally stacking a second module on top of a first module has been shown to provide cooling over a larger temperature difference and increases in efficiency. As illustrated, when thermoelectric modules are longitudinally stacked, the plates are parallel and no portion of any plate resides in a horizontal plane with portions of any other plate. Thermoelectric module 300 can be formed by coupling a second array of thermoelectric elements 352 and a third plate 303 to thermoelectric module 200. The result is a first array of thermoelectric elements 351 between a first plate 301 and a second plate 302, also known as an intermediate plate, and a second array of thermoelectric elements 352 between second plate 302 and third plate 303.

Arrays of thermoelectric elements 351 and 352 include a plurality of thermoelectric elements 380 separated by insulators 382. A thermoelectric element 380 may be made of either P-type or N-type thermoelectric material. Arrays of thermoelectric elements 351 and 352 may include thermoelectric elements 380 of both N-type and P-type, which may or may not be arranged in an alternating pattern depending on the arrangement of the electrical interconnects between the thermoelectric elements 380. In the illustrated embodiment, insulators 382 are spaces that are open to the ambient environment. In an alternative embodiment, insulators 382 may be thermally and electrically insulating material.

An object to be cooled may be coupled to third plate 303 and a heat sink may be coupled to first plate 301. In this configuration the temperature difference between the object to be cooled and the heat sink, ignoring any temperature difference across plates 301, 302, and 303, is divided between first array of thermoelectric elements 351 and second array of thermoelectric elements 352. Thermoelectric module 300 shows efficiency increases over thermoelectric module 200 and can achieve a larger temperature differential across the exterior plates 301 and 303.

Stages may be connected longitudinally as shown in FIG. 4 for a two-stage cooler. This design has the advantage of minimizing the thermal resistance between one array of elements and the next, but also has some disadvantages. One disadvantage of thermoelectric module 300 is its increased height over thermoelectric module 200. A second disadvantage is the complex nature of the assembly process. Each stage of the module may be fabricated separately in a first assembly step, and the stages put together in a second assembly step. A third disadvantage is the difficulty in making the electrical connections between each successive stage of the multistage module. Electrically coupling each stage may require metallized through holes in the plate 302 to transfer the electrical current from the surface of plate 302 facing plate 301 to the surface of plate 302 facing plate 303. If metallized through holes are not used, electrically conductive ribbon may be formed and attached to the surfaces of plate 302 to transfer current. An object of the present invention is to maintain the advantages of thermoelectric module 300 while reducing or eliminating its disadvantages.

Figure 5A:
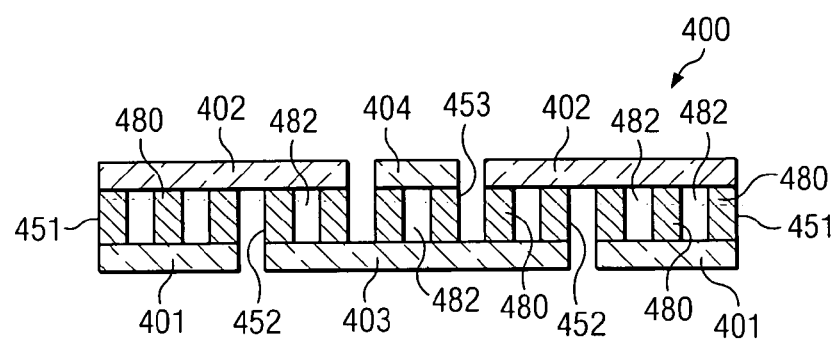
FIG. 5A illustrates a profile view of one embodiment of a transverse multistage thermoelectric module in accordance with the teachings of the present invention.

FIGS. 5A-5F illustrate several embodiments of a transverse multi-stage thermoelectric module. For the purposes of this application, a multistage thermoelectric module is a transverse module when there are at least two parallel sets of plates, with thermoelectric elements disposed between the sets, and at least a portion of the plates have horizontal cross sections (when viewed in profile as in FIG. 5A) that reside in a common plane with horizontal cross sections (when viewed in profile as in FIG. 5A) of other plates from the same set. FIG. 5A is a profile view of a transverse three-stage thermoelectric module 400. First plates 401 and second plates 402 are illustrated as having two sections. Coupled to first plates 401 is first array of thermoelectric elements 451. Second plates 402 are coupled to first array of thermoelectric elements 451 and second array of thermoelectric elements 452. Third plate 403 is coupled both to second array of thermoelectric elements 452 and third array of thermoelectric elements 453. Fourth plate 404 is coupled to third array of thermoelectric elements 453 and may also be coupled to a device to be cooled.

Arrays of thermoelectric elements 451, 452, and 453 include a plurality of thermoelectric elements 480 separated by insulators 482. A thermoelectric element 480 may be made of either P-type or N-type thermoelectric material. Arrays of thermoelectric elements 451, 452, and 453 may include thermoelectric elements 480 of both N-type and P-type, which may or may not be arranged in an alternating pattern depending on the arrangement of the electrical interconnects between the thermoelectric elements 480. In the illustrated embodiment, insulators 482 are spaces that are open to the ambient environment. In an alternative embodiment, insulators 482 may be thermally and electrically insulating material.

The device to be cooled may be coupled not only to fourth plate 404 but may also overlap onto portions of one, or both, of second plates 402. In this manner, hot spots that might occur at the center of the device to be cooled would be exposed to the coolest plate, plate 404. Plates 402 are relatively cool in comparison to plates 401. Therefore, lower wattage areas of the device to be cooled may be disposed over plates 402 and have thermal energy transferred through first array of thermoelectric elements 451 to plates 401. Regardless of how many plates the device to be cooled spans, the remaining plates may be coupled to heat sinks, to traditional thermoelectric modules, or to additional arrays of thermoelectric elements and additional plates.

As illustrated in FIG. 5A, the number of thermoelectric elements 480 decreases in each progressive stage of thermoelectric module 400. The first stage of the thermoelectric module is illustrated by first array of thermoelectric elements 451, which has six thermoelectric elements 480. The second stage is illustrated by second array of thermoelectric elements 452, which has four thermoelectric elements 480. The third stage of thermoelectric module 400 is illustrated with two thermoelectric elements 480 in third array of thermoelectric elements 453. Thus, the first stage contains more elements than the second stage, which contains more elements than the third stage.

In this configuration, the third stage elements dissipate heat from a device to be cooled coupled to fourth plate 404. The second stage elements 452 dissipate the heat from the device coupled to fourth plate 404 and the heat generated by the electrical current passing through the third stage elements 453. Likewise, the first stage elements 451 dissipate heat from the device coupled to the fourth plate 404 and the heat generated by the electrical current passing through the second and third stage elements 452 and 453. This arrangement allows each successive stage to pump not only the heat dissipated by the device to be cooled that is thermally coupled to the third stage, but also the heat generated in the cooler stages. This arrangement also allows each thermoelectric stage operating between plate 404 and plates 401 to have similar efficiencies.

Thermoelectric module 400 is a three-stage thermoelectric module that may be the same thickness as single-stage thermoelectric module 200. Thermoelectric module 400 achieves efficiency increases over single-stage thermoelectric module 200. Thermoelectric module 400 may also provide a temperature differential and/or differential heat pumping ability between the plates of the top or bottom side of thermoelectric module 400, which may be desirable in particular applications.

In the transverse staging scheme, the physical direction of the temperature gradient alternates between stages. In this manner, an arbitrary number of thermally distinct temperature plates may be accommodated in two planes. Thus the multistage device is physically similar to a single stage device, and can be fabricated using single stage manufacturing methods. Electrical connections between stages of a transverse thermoelectric cooler may be made by simple patterning of conductors in a single plane on the plates of the cooler. There is no need for metallized through holes or conductive ribbons to conduct current from one surface of a plate to the opposite surface.

Figure 5B:
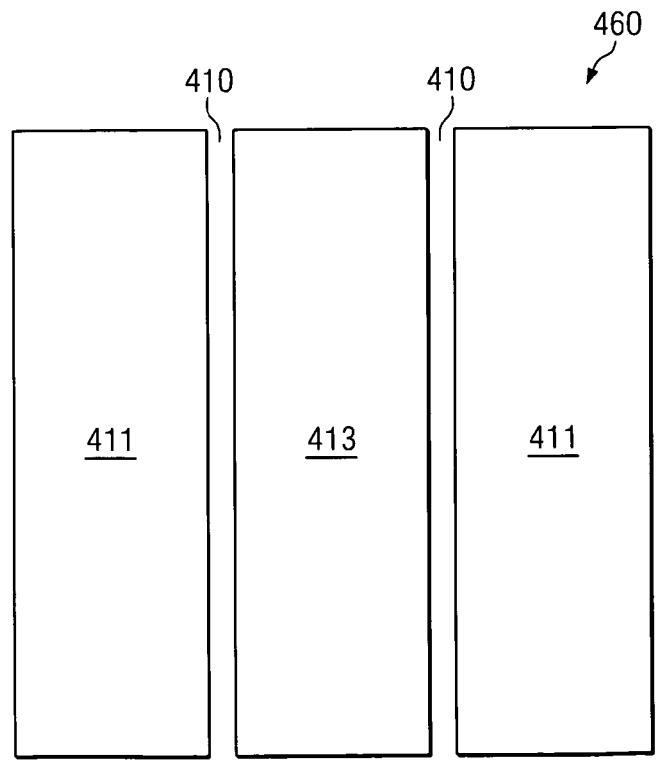
FIG. 5B illustrates a top view of one embodiment of a rectangular transverse multistage thermoelectric module in accordance with the teachings of the present invention.
Figure 5C:
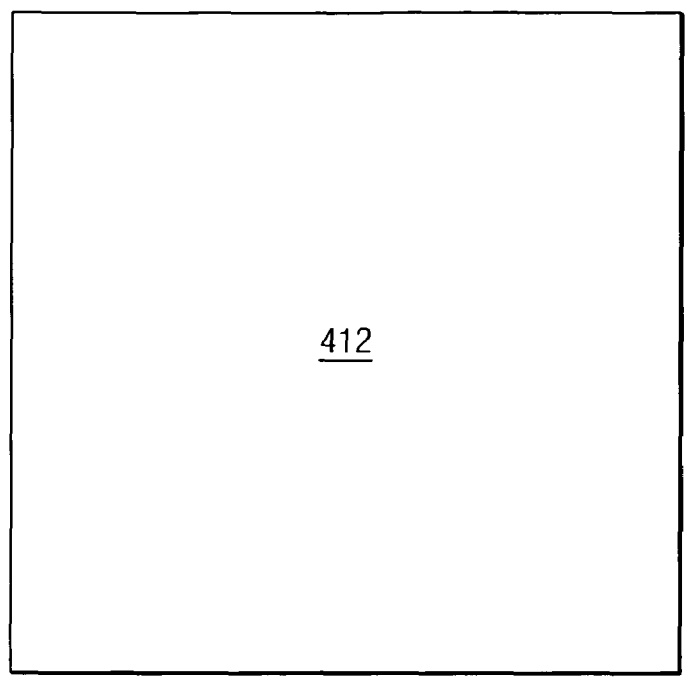
FIG. 5C illustrates a bottom view of the rectangular transverse multistage thermoelectric module of FIG. 5B in accordance with the teachings of the present invention.

FIG. 5B illustrates a top view of a transverse two-stage thermoelectric module 460. First plates 411 may be coupled to a first array of thermoelectric elements, and third plate 413 may be coupled to a second array of thermoelectric elements. Each of the first and second arrays of thermoelectric elements may be coupled to a second plate 412, a view of which is illustrated in FIG. 5C.

First plates 411 and third plate 413 may be thermally isolated by cuts 410. Thermoelectric module 460 may be assembled with first plates 411 and third plate 413 being a single piece. After assembly, cuts 410 may be made, thereby separating first plates 411 from third plate 413. In this manner, traditional manufacturing and assembly methods, modified by the cuts made after assembly, may be used to manufacture thermoelectric module 460.

A device to be cooled may be coupled to plate 413, and a heat sink may be coupled to plates 411. In this manner, the heat sink could dissipate the heat generated by the device to be cooled and the heat generated within thermoelectric module 460. In this configuration, the heat sink and the device to be cooled are on the same side of thermoelectric module 460.

Figure 5D:
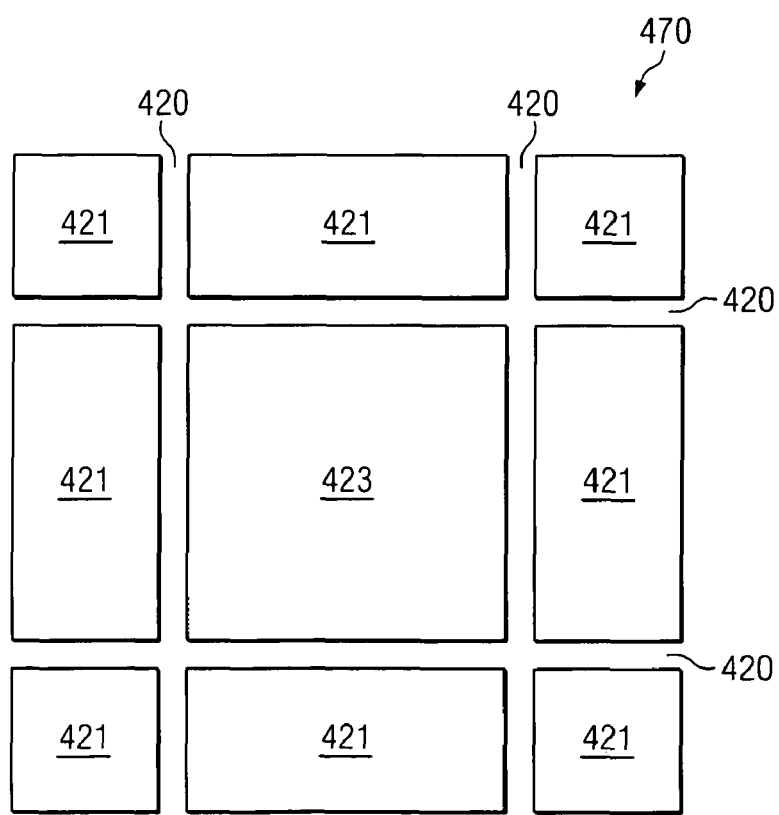
FIG. 5D illustrates a top view of an alternative embodiment of a rectangular transverse multistage thermoelectric module in accordance with the teachings of the present invention.

FIG. 5D illustrates an alternative embodiment of transverse two-stage thermoelectric module 460. Thermoelectric module 470 has four cuts 420 to isolate first plates 421 from third plate 423. As discussed earlier regarding thermoelectric module 460, cuts 420 may be made after assembly of thermoelectric module 470. The number of divisions which may be made is practically unlimited. Additionally, further cuts 420 may be made for the purposes of thermally segmenting additional stages.

Thermoelectric modules 460 and 470 may be used with a second plate 412 as illustrated in FIG. 5C, or they may have a back plate which has been segmented into additional stages. Like the front plates illustrated in FIGS. 5B and 5D, the back plates may be assembled into a thermoelectric module and then segmented into the individual plates.

Figure 5E:
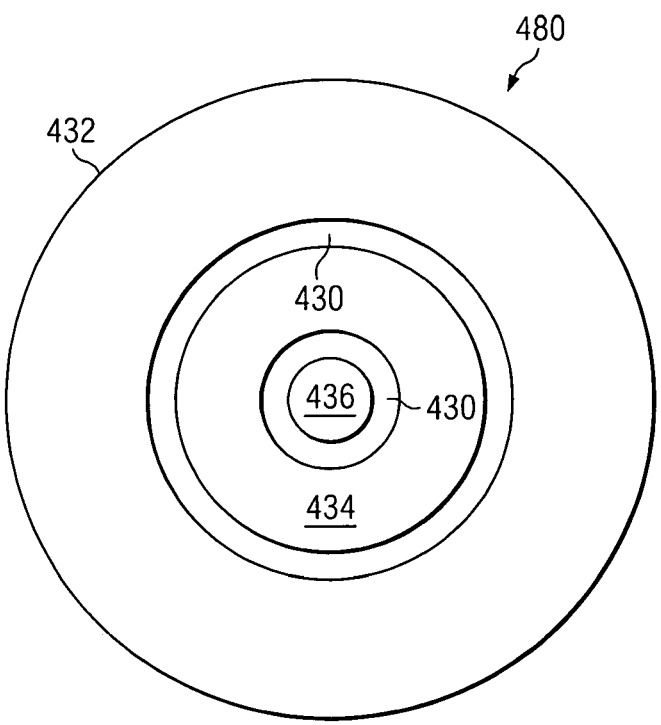
FIG. 5E illustrates a top view of one embodiment of a circular transverse multistage thermoelectric module in accordance with the teachings of the present invention.
Figure 5F:
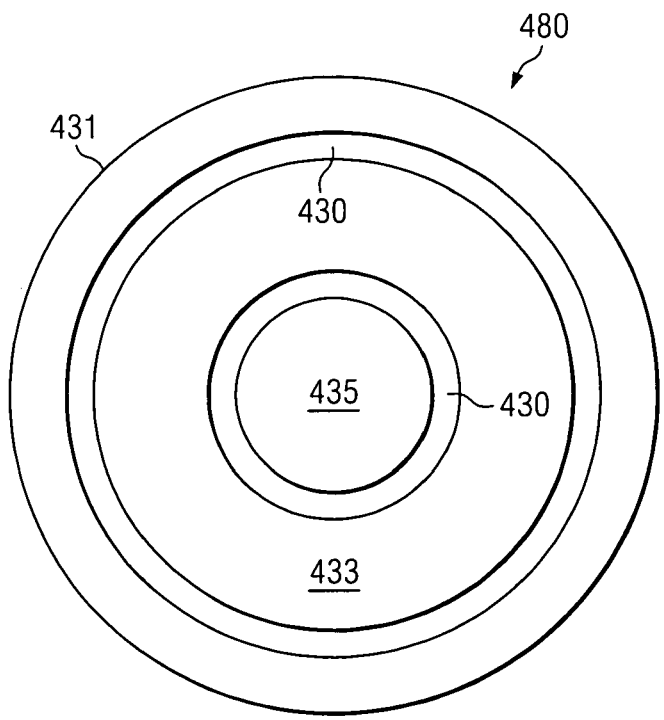
FIG. 5F illustrates a bottom view of one embodiment of a circular transverse multistage thermoelectric module in accordance with the teachings of the present invention.

FIGS. 5E and 5F illustrate top and bottom views, respectively, of a circular transverse five-stage thermoelectric module 480. Thermoelectric module 480 differs from the thermoelectric module illustrated in FIGS. 5B, 5C, and 5D because it is circular in shape rather than being square or rectangular in shape. Additionally, unlike the two stage thermoelectric modules 460 and 470, the coolest plate 436 and the hottest plate 431, and therefore, a device to be cooled and a heat dissipation device, such as a heat sink, may be located on opposite sides of thermoelectric module 480.

A first array of thermoelectric elements may be coupled between first plate 431 and second plate 432. A second array of thermoelectric elements may be coupled between second plate 432 and third plate 433. A third array of thermoelectric elements may be coupled between third plate 433 and fourth plate 434. This pattern continues for fifth plate 435 and sixth plate 436.

In alternative embodiments, the pattern may be continued for as many stages as are desired. In further alternative embodiments, the geometry of the plates is not limited to circular, square, or rectangular, but may be practically any shape. Further, the plates may be formed or cut to an application specific shape. As discussed previously with respect to FIGS. 5B and 5D, the cuts 430 in thermoelectric module 480 may be made after assembly of thermoelectric module 480.

Figure 6A:
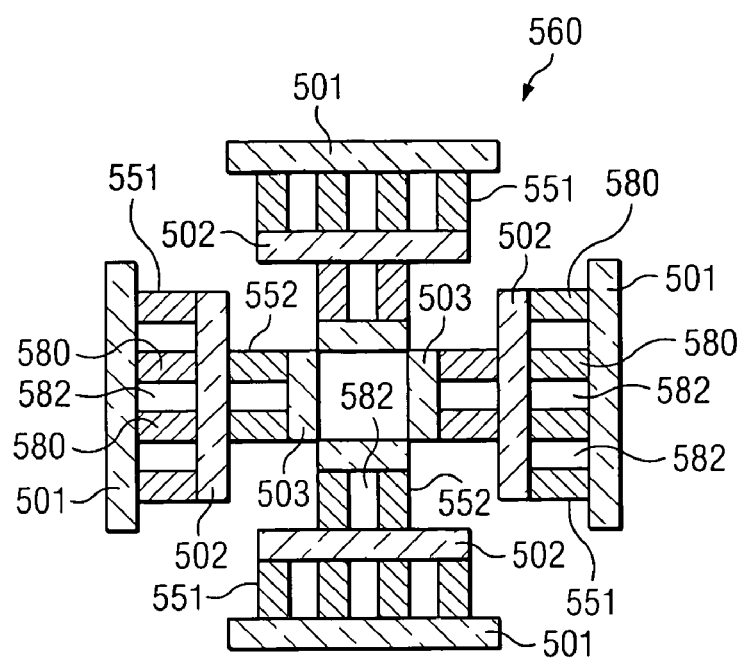
FIG. 6A illustrates a top view of a rectangular radial multistage thermoelectric module in accordance with the teachings of the present invention.
Figure 6B:
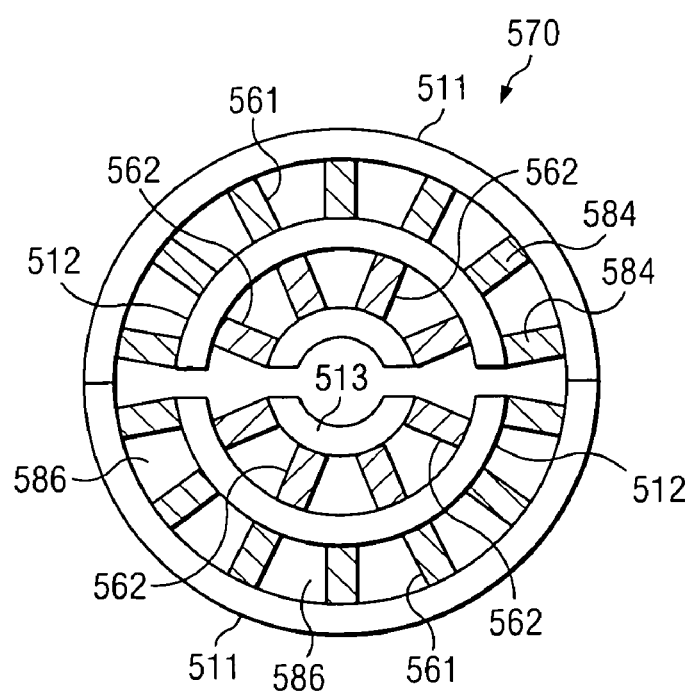
FIG. 6B illustrates a top view of a circular radial multistage thermoelectric module in accordance with the teachings of the present invention.

FIGS. 6A and 6B illustrate alternative embodiments of the present invention. FIG. 6A illustrates a top view of thermoelectric module 560, and FIG. 6B illustrates a top view of thermoelectric module 570. Thermoelectric modules 560 and 570 differ from thermoelectric module 400 because rather than having a transverse staging scheme, thermoelectric modules 560 and 570 have radial staging schemes. That is, the plates and arrays of thermoelectric elements are arranged radially outward from the device to be cooled. Thus, the thermoelectric elements and the plates are coplanar, and the coolest plate surrounds the device to be cooled. For the purposes of this specification, when two or more elements are coplanar, at least a portion of each element resides in a common plane with at least a portion of every other element.

In the radial staging schemes, an object to be cooled may be located at the center of the cooler in thermal communication with a number of temperature plates that surround it. Successive stages may surround earlier stages. If desired, the elements might all be located in a single plane, which could be advantageous for manufacturing. Unlike the case of transverse staging, however, in radial staging the elements are oriented such that the current flow and thermal gradient are parallel to the plane in which the elements are arranged.

Specifically, as illustrated in FIG. 6A, thermoelectric module 560 is a radial two-stage thermoelectric module. First plates 501, second plates 502, and third plates 503 each include four sections or plates that are radially arranged around the device to be cooled in a generally square or rectangular pattern. Thermoelectric elements 580 of first array of thermoelectric elements 551 may be distributed between first plates 501 and second plates 502. Likewise, thermoelectric elements 580 of second array of thermoelectric elements 552 may be distributed between second plates 502 and third plates 503. In this manner thermal energy may be removed from a device to be cooled coupled to third plates 503, through third plates 503, and radially outward into first plates 501. A heat sink(s) may be attached to first plates 501 to dissipate this heat to the ambient environment.

Arrays of thermoelectric elements 551 and 552 include a plurality of thermoelectric elements 580 separated by insulators 582. A thermoelectric element 580 may be made of either P-type or N-type thermoelectric material. Arrays of thermoelectric elements 551 and 552 may include thermoelectric elements 580 of both N-type and P-type, which may or may not be arranged in an alternating pattern depending on the arrangement of the electrical interconnects between the thermoelectric elements 580. In the illustrated embodiment, insulators 582 are spaces that are open to the ambient environment. In an alternative embodiment, insulators 582 may be thermally and electrically insulating material.

In an alternative embodiment, the four sections of each of first plates 501, second plates 502, and third plates 503 may not be segmented, but may contact the other sections of the respective plates, forming concentric squares or rectangles. Further alternative embodiments of thermoelectric module 560 may increase the number of stages and/or the number and distribution of plates.

FIG. 6B illustrates a radial two-stage thermoelectric module 570. First plates 511, second plates 512, and third plates 513 are all illustrated as arcuate plates. In this embodiment, third plates 513 may wrap around a device to be cooled. The thermoelectric elements of second array of thermoelectric elements 562 are illustrated as distributed around the circumference of third plates 513. Likewise, the thermoelectric elements of first array of thermoelectric elements 561 are illustrated as distributed around the circumference of second plates 512. With this distribution of plates and thermoelectric elements, thermal energy may be pumped from the object to be cooled radially outwards through the stages of thermoelectric module 570 and to the ambient environment. A heat sink(s) may be coupled to the circumference of first plates 511.

Arrays of thermoelectric elements 561 and 562 include a plurality of thermoelectric elements 584 separated by insulators 586. A thermoelectric element 584 may be made of either P-type or N-type thermoelectric material. Arrays of thermoelectric elements 561 and 562 may include thermoelectric elements 584 of both N-type and P-type, which may or may not be arranged in an alternating pattern depending on the arrangement of the electrical interconnects between the thermoelectric elements 584. In the illustrated embodiment, insulators 586 are spaces that are open to the ambient environment. In an alternative embodiment, insulators 586 may be thermally and electrically insulating material.

In an alternative embodiment of thermoelectric module 570, each of the arcuate plates may not comprise two sections, as illustrated, but may comprise circular plates. That is, third plates 513 may be a single circle rather than two arcuate sections, and the same may be true for second plates 512 and first plates 511. In a further alternative embodiment, only half of thermoelectric module 570 may be used in an application. Such an embodiment may be desirable when a semi-circular thermoelectric module best fits a device to be cooled.

FIGS. 6A and 6B illustrate two embodiments of a radial multi-stage thermoelectric module. Alternative embodiments of radial thermoelectric modules, as contemplated by the present invention, may include any geometric shapes, any number of plates, any number of thermoelectric elements, and any number of stages. Furthermore, the embodiments in FIGS. 6A and 6B are illustrated as having only a single tier (perpendicular to the page) of thermoelectric elements and plates. However, any number of tiers of thermoelectric elements and plates may be used in one or more of the stages.

Combinations of radial or transverse multistage thermoelectric coolers along with traditional single or multistage thermoelectric coolers are possible within the same thermoelectric device. In such a configuration, radiation shielding may be simplified, additional thermal loads from connecting wires run to the object being cooled may be minimized and the overall shape of the thermoelectric cooler may be modified making the thermoelectric cooler shorter and more cubic, thereby allowing for less expensive vacuum dewars or packaging.

Figure 7:
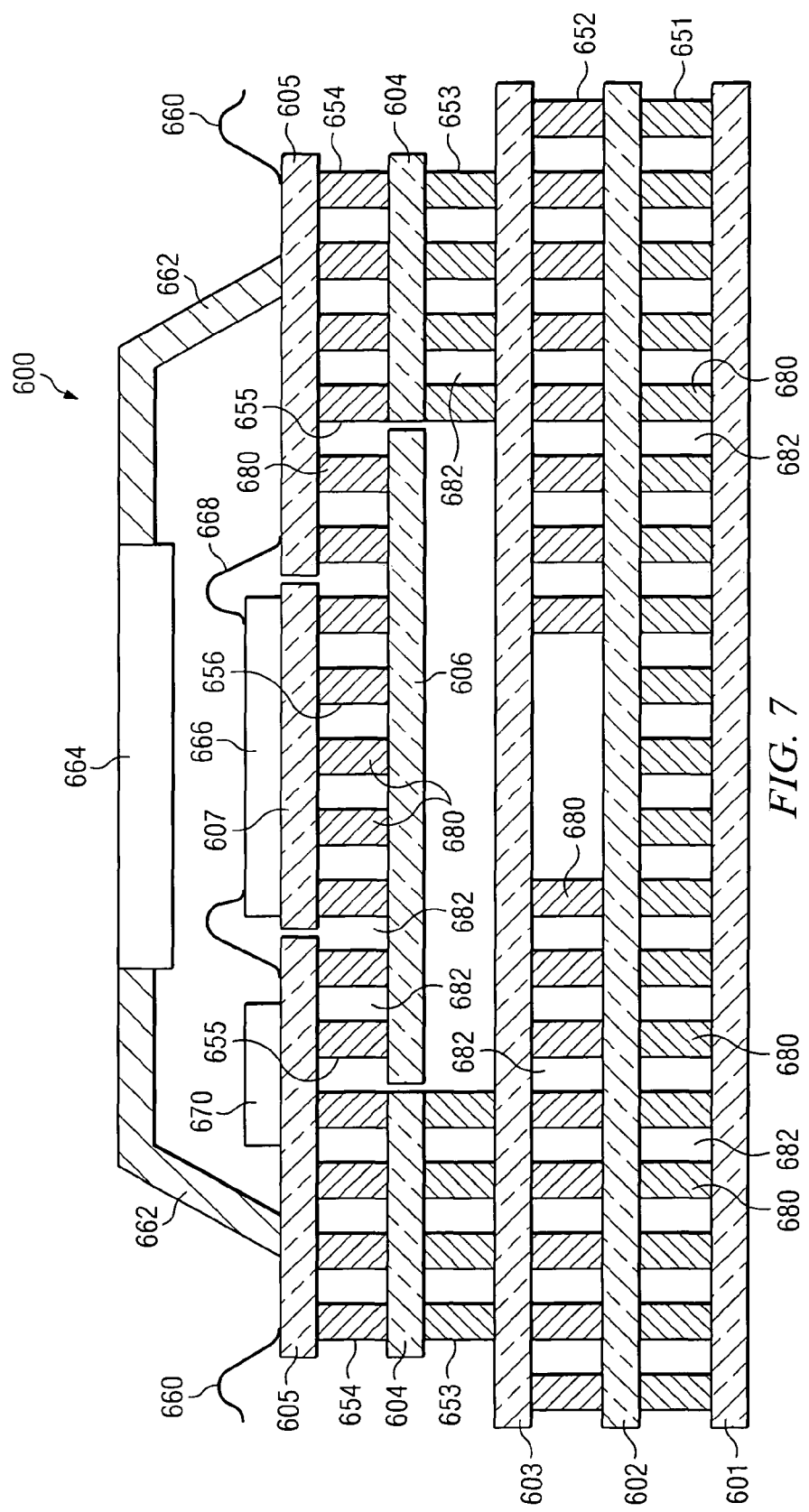
FIG. 7 illustrates a profile view of a multistage thermoelectric module combining a multistage transverse thermoelectric module with a longitudinally stacked multistage thermoelectric module in accordance with the teachings of the present invention.

FIG. 7 illustrates a particular embodiment of the present invention utilizing a three stage transverse thermoelectric module coupled to a three stage longitudinal thermoelectric module. As illustrated in FIG. 7, thermoelectric module 600 is a six-stage thermoelectric module. First plate 601 and second plate 602, in combination with first array of thermoelectric elements 651, form the first stage. Second plate 602 and third plate 603, with second array of thermoelectric elements 652, form the second stage. Third plate 603 and fourth plates 604, with third array of thermoelectric elements 653, form the third stage. The first, second and third stages form a traditional longitudinal thermoelectric module with progressively fewer thermoelectric elements in each stage. The first stage of the transverse portion (fourth stage overall) of thermoelectric module 600 is formed by fourth plates 604 and fifth plates 605, along with fourth array of thermoelectric elements 654. The fifth stage is formed by fifth plates 605, fifth array of thermoelectric elements 655, and sixth plate 606. The sixth stage is formed by sixth plate 606, sixth array of thermoelectric elements 656 and seventh plate 607.

Arrays of thermoelectric elements 651, 652, 653, 654, 655, and 656 include a plurality of thermoelectric elements 680 separated by insulators 682. A thermoelectric element 680 may be made of either P-type or N-type thermoelectric material. Arrays of thermoelectric elements 651, 652, 653, 654, 655, and 656 may include thermoelectric elements 680 of both N-type and P-type, which may or may not be arranged in an alternating pattern depending on the arrangement of the electrical interconnects between the thermoelectric elements 680. In the illustrated embodiment, insulators 682 are spaces that are open to the ambient environment. In an alternative embodiment, insulators 682 may be thermally and electrically insulating material.

In an alternative embodiment, third array of thermoelectric elements 653 may be replaced with an adhesive and/or conductive plate. In this embodiment a transverse three stage thermoelectric module (plates 604, 605, 606, and 607 and arrays of thermoelectric elements 654, 655, and 656) would be coupled to a longitudinally stacked two stage thermoelectric module (plates 601, 602, and 603, and arrays of thermoelectric modules 651 and 652). The two thermoelectric modules could be manufactured separately and coupled together by any suitable system or method. The result would be a five stage thermoelectric module which is relatively simpler to manufacture than the six stage thermoelectric module illustrated in FIG. 7.

FIG. 7 illustrates device to be cooled 666 coupled to seventh plate 607. In this manner, heat may be transferred from device to be cooled 666 through seventh plate 607 through the stages of thermoelectric module 600 and to a heat sink coupled to first plate 601.

FIG. 7 also illustrates a second device to be cooled 670 coupled to one of fifth plates 605. While the coolest plate of thermoelectric module 600 would be seventh plate 607, fifth plates 605 are cooler than first plate 601, and, depending on the heat transfer requirements of second device 670, may provide adequate cooling for second device to be cooled 670.

FIG. 7 also illustrates leads 660 and 668 coupled to fifth plates 605. Leads 668 are also coupled to device to be cooled 666. Leads 660 and 668 may provide electrical current to device to be cooled 666. The flow of electrical current through leads 660 and 668 may cause leads 660 and 668 to generate thermal energy. Coupling leads 660 and 668 through fifth plates 605 by, for example, soldering leads 660 and 668 to a conductive strip disposed on fifth plates 605, may reduce the conductive heat transfer from lead 660 into device to be cooled 666 by transferring a portion of that heat into fifth plates 605. In an alternative embodiment, leads 660 may also be used to supply electrical current to thermoelectric module 600.

Thermoelectric module 600 is also illustrated with a shield 662 and a cold filter 664 coupled to fifth plates 605. Shield 662 and cold filter 664 may be used to shield the device to be cooled 666 from radiative heat transfer from the surrounding ambient. Shield 662 and cold filter 664 are thermally coupled to plate 605, thereby significantly reducing the radiative heat transfer to which device to be cooled 666 might otherwise be subjected. Radiated thermal energy from the ambient may be absorbed by the radiation shield and cold filter and removed from shield 662 and filter 664 by coupling them to fifth plates 605.

The new staging designs described above may reduce or eliminate certain disadvantages associated with multistage coolers. The advantages of the new designs may include: thermoelectric modules may be built by single stage manufacturing methods, with certain adaptations; the physical profile of the thermoelectric module may be shorter in the transverse design; the physical profile of the thermoelectric module may be altogether different in the radial designs, perhaps fitting certain packages better; shielding of radiation heat loads may be improved and simpler to implement; the new designs may naturally accommodate the larger numbers of thermoelectric elements which may be required in the warmer stages; and the new designs may reduce or eliminate the need for wrap-around tabs or metallized through-holes to connect stage to stage as in a traditional thermoelectric cooler configuration.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A thermoelectric module, comprising:
   a first thermally conductive plate;
   a first array of thermoelectric elements coupled to the first plate;
   the first array of thermoelectric elements including a first plurality of thermoelectric elements;
   a second thermally conductive plate coupled to the first array of thermoelectric elements;
   a second array of thermoelectric elements coupled to the second plate;
   the second array of thermoelectric elements including a second plurality of thermoelectric elements; and
   a third thermally conductive plate coupled to the second array of thermoelectric elements; wherein:
   at least a portion of each thermoelectric element of the first and second pluralities of thermoelectric elements are coplanar with at least a portion of every other thermoelectric element of the first and second pluralities of thermoelectric elements along a plane perpendicular to a direction of thermal energy transfer through the thermoelectric elements once the thermoelectric elements receive power; and
   the thermoelectric elements are arranged between the thermally conductive plates such that thermal energy is transferred successively from one array to the next in a radial direction once the thermoelectric elements receive power.

2. The thermoelectric module of claim 1, wherein at least a portion of the first, second, and third plates are coplanar with at least a portion of each of thermoelectric elements of the first and second pluralities of thermoelectric elements.

3. The thermoelectric module of claim 1, wherein:
   the second array of thermoelectric elements is operable to transfer thermal energy from the third plate to the second plate; and
   the first array of thermoelectric elements is operable to transfer thermal energy from the second plate to the first plate.

4. The thermoelectric module of claim 1, wherein the first plurality of thermoelectric elements includes a greater number of thermoelectric elements than the second plurality of thermoelectric elements.

5. The thermoelectric module of claim 1, wherein:
   the first plate includes first, second, third, and fourth sections arranged in a generally rectangular shape;
   the second plate includes first, second, third, and fourth sections arranged in a generally rectangular shape; and the third plate includes first, second, third, and fourth sections arranged in a generally rectangular shape.

6. The thermoelectric module of claim 5, wherein each of the first, second, third, and fourth sections of the first plate are physically separated from each of the others of the first, second, third, and fourth sections of the first plate.

7. The thermoelectric module of claim 6, wherein each of the first, second, third, and fourth sections of the second plate are physically separated from each of the others of the first, second, third, and fourth sections of the second plate.

8. The thermoelectric module of claim 5, wherein:
a portion of the first plurality of thermoelectric elements are coupled to each of the first, second, third, and fourth sections of the first plate; and
a portion of the second plurality of thermoelectric elements are coupled to each of the first, second, third, and fourth sections of the second plate.

9. The thermoelectric module of claim 5, wherein:
the first, second, and third plates are arranged around a heat sensitive device; and
the first and second arrays of thermoelectric elements are arranged around the heat sensitive device; and
the first and second arrays of thermoelectric elements are operable to transfer thermal energy away from the heat sensitive device.

10. The thermoelectric module of claim 1, wherein:
the second plate is generally parallel to the first and third plates; and
a cross section of the first plate, taken parallel to the second plate, is coplanar with a cross section of the third plate, taken parallel to the second plate.

11. A thermoelectric module, comprising:
a first thermally conductive plate;
a first array of thermoelectric elements coupled to the first plate;
the first array of thermoelectric elements including a first plurality of thermoelectric elements;
a second thermally conductive plate coupled to the first array of thermoelectric elements;
a second array of thermoelectric elements coupled to the second plate;
the second array of thermoelectric elements including a second plurality of thermoelectric elements;
a third thermally conductive plate coupled to the second array of thermoelectric elements;
a third array of thermoelectric elements coupled to the third plate;
the third array of thermoelectric elements including a third plurality of thermoelectric elements;
a fourth thermally conductive plate coupled to the third array of thermoelectric elements;
a fourth array of thermoelectric elements coupled to the fourth plate;
the fourth array of thermoelectric elements including a fourth plurality of thermoelectric elements;
a fifth thermally conductive plate coupled to the fourth array of thermoelectric elements; and
wherein at least a portion of each thermoelectric element of the second, third, and fourth pluralities of thermoelectric elements are coplanar with at least a portion of every other thermoelectric element of the second, third, and fourth pluralities of thermoelectric elements along a plane perpendicular to a direction of thermal energy transfer through the thermoelectric elements once the thermoelectric elements receive power;
wherein at least a portion of each of the thermoelectric elements of the first array of thermoelectric elements reside in a plane perpendicular to the direction of thermal energy transfer in which no portion of any one of the thermoelectric elements of the second, third, and fourth arrays of thermoelectric elements reside; and
wherein the thermoelectric elements of the second, third, and fourth pluralities of thermoelectric elements are arranged between the thermally conductive plates such that thermal energy is transferred successively from one array to the next in the second third and fourth arrays in a radial direction once the thermoelectric elements receive power.

12. A method of manufacturing a thermoelectric module, comprising:
coupling a first array of thermoelectric elements to a first thermally conductive plate;
the first array of thermoelectric elements including a first plurality of thermoelectric elements;
coupling a second thermally conductive plate to the first array of thermoelectric elements;
coupling a second array of thermoelectric elements to the second plate;
the second array of thermoelectric elements including a second plurality of thermoelectric elements;
coupling a third thermally conductive plate to the second array of thermoelectric elements;
arranging the thermoelectric elements between the thermally conductive plates such that thermal energy is transferred successively from one array to the next in a radial direction once the thermoelectric elements receive power; wherein
at least a portion of each thermoelectric element of the first and second pluralities of thermoelectric elements are coplanar with at least a portion of every other thermoelectric element of the first and second pluralities of thermoelectric elements along a plane perpendicular to a direction of thermal energy transfer through the thermoelectric elements once the thermoelectric elements receive power.

13. The method of claim 12, wherein at least a portion of the first, second, and third plates are coplanar with at least a portion of each thermoelectric element of the first and second pluralities of thermoelectric elements.

14. The method of claim 12, further comprising:
transferring thermal energy from the third plate to the second plate by applying a current to the second array of thermoelectric elements; and
transferring thermal energy from the second plate to the first plate by applying a current to the first array of thermoelectric elements.

15. The method of claim 12, further comprising:
arranging first, second, third, and fourth sections of the first plate in a generally rectangular shape;
arranging first, second, third, and fourth sections of the second plate in a generally rectangular shape; and
arranging first, second, third, and fourth sections of the third plate in a generally rectangular shape.

16. The method of claim 15, further comprising:
arranging the first, second, and third plates around a heat sensitive device;
arranging the first and second arrays of thermoelectric elements around the heat sensitive device; and
the first and second arrays of thermoelectric elements being operable to transfer thermal energy away from the heat sensitive device.

17. The method of claim 12, further comprising:
disposing the first array of thermoelectric elements between the first and second plates; and disposing the second array of thermoelectric elements between the second and third plates.

18. The method of claim 12, wherein:
the second plate is generally parallel to the first and third plates; and
a cross section of the first plate, taken parallel to the second plate, is coplanar with a cross section of the third plate, taken parallel to the second plate.

19. The method of claim 18, further comprising forming the first and third plates by cutting apart a single large plate after the first array of thermoelectric elements have been coupled to the first plate and the third plate has been coupled to the second array of thermoelectric elements.

20. The method of claim 12, further comprising:
the first plate including a plurality of plates; and
forming the plurality of plates by cutting apart a single large plate after the first array of thermoelectric elements have been coupled to the first plate.

21. A device, comprising a transverse multi-stage thermoelectric module having at least two parallel sets of thermally conductive and electrically insulating plates and a plurality of thermoelectric elements coupled therebetween, wherein thermal energy is transferred successively from one stage to the next through one or more of the at least two parallel sets of electrically insulating plates, once the transverse multi-stage thermoelectric module receives power.

22. The thermoelectric module of claim 1, wherein the first array is arranged around the second array.

23. The thermoelectric module of claim 1, wherein the first array surrounds the second array.

24. The method of claim 11 wherein the second, third, and fourth arrays are arranged such that the direction of thermal energy transfer through the thermoelectric elements alternates between each of the second, third, and fourth arrays.

25. The thermoelectric module of claim 1, wherein the thermal energy is transferred successively from one array to the next in a direction parallel to the plane though one or more of the plates once the thermoelectric elements receive power.

26. The thermoelectric module of claim 1, wherein the thermally conductive plates are electrically insulating; and
the first array and the second array are arranged such that the direction of thermal energy transfer through the thermoelectric elements alternates between the first array and the second array.

27. The device of claim 21, wherein the plurality of stages of the transverse multi-stage thermoelectric module are arranged thermally in series such that thermal energy is transferred through the plates successively from one stage to the next in a radial direction away from a centermost stage, once the transverse multi-stage thermoelectric module receives power.

28. The device of claim 21, wherein the plurality of thermoelectric elements is separated into a plurality of stages arranged around one another in a radial layout such that thermal energy is transferred successively from one stage to the next in a radial direction away from a centermost stage, once the transverse multi-stage thermoelectric module receives power.

29. The device of claim 21, wherein one stage of the multi-stage thermoelectric module surrounds another stage of the multi-stage thermoelectric module.

30. The device of claim 21, wherein the multi-stage thermoelectric module is arranged such that the direction of thermal energy transfer through the thermoelectric elements alternates from one stage to the next in the multi-stage thermoelectric module.

31. The device of claim 28, wherein each stage that is arranged another stage includes more thermoelectric elements than the stage around which it is arranged.

* * * * *